United States Patent
Padaparambil

(10) Patent No.: US 7,079,055 B2
(45) Date of Patent: Jul. 18, 2006

(54) LOW-POWER SERIALIZER WITH HALF-RATE CLOCKING AND METHOD

(75) Inventor: Muralikumar A. Padaparambil, Poughkeepsie, NY (US)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/990,120

(22) Filed: Nov. 16, 2004

(65) Prior Publication Data

US 2006/0103557 A1 May 18, 2006

(51) Int. Cl.
*H03M 9/00* (2006.01)
(52) U.S. Cl. ...................... 341/101; 341/100
(58) Field of Classification Search ............... 341/100, 341/101
See application file for complete search history.

(56) References Cited

U.S. PATENT DOCUMENTS

| | | | |
|---|---|---|---|
| 4,829,471 A | 5/1989 | Banerjee et al. | |
| 5,357,249 A * | 10/1994 | Azaren et al. | 341/100 |
| 5,572,721 A | 11/1996 | Rostamian | |
| 5,689,731 A | 11/1997 | West et al. | |
| 5,798,720 A | 8/1998 | Yano | |
| 5,844,844 A | 12/1998 | Bauer et al. | |
| 5,982,309 A | 11/1999 | Xi et al. | |
| 6,107,946 A * | 8/2000 | Jeong | 341/101 |
| 6,301,322 B1 | 10/2001 | Manning | |
| 6,335,696 B1 | 1/2002 | Aoyagi et al. | |
| 6,348,825 B1 | 2/2002 | Galbi et al. | |
| 6,608,513 B1 | 8/2003 | Tschanz et al. | |
| 6,614,371 B1 * | 9/2003 | Zhang | 341/101 |
| 2003/0201920 A1 * | 10/2003 | Zhang | |

* cited by examiner

*Primary Examiner*—Jean Bruner Jeanglaude
(74) *Attorney, Agent, or Firm*—Michael T. Gabrik

(57) ABSTRACT

A serializer for multiplexing $2^N$ data streams, each data stream having a frequency of $f/(2^N)$, N being a positive integer. The serializer comprises $2^N-1$ instances of a dual-edge multiplexer flip-flop circuit, N frequency domains including a first frequency domain having the frequency $f/2^N$ and a last frequency domain having a frequency $f/2$, and an output providing serialized data at frequency f clocked at half that rate. Thus, the highest clock signal frequency input into the serializer is $f/2$.

13 Claims, 4 Drawing Sheets

LOW-POWER SERIALIZER WITH HALF-RATE CLOCKING AND METHOD

CROSS REFERENCE TO RELATED APPLICATION

This application is related to commonly-assigned U.S. patent application Ser. No. 10/990,119, filed concurrently herewith in the name of the inventor of this application, and entitled, "Dual-Edge Triggered Multiplexer Flip-Flop And Method." This related application is incorporated by reference herein in its entirety.

BACKGROUND OF THE INVENTION

1. Field of the Invention

The present invention relates generally to an electronic circuit for serializing data from an incoming parallel data stream.

2. Description of the Related Art

The serializer is a key component in serial digital communication applications. In such systems, serializers are used to convert multi-bit low speed parallel data into high-speed serial data. For high-frequency applications, completely full-swing CMOS serializers are not considered due to their high power consumption. To reduce power, the high-speed blocks are designed using a differential logic family such as Current Mode Logic, but if the whole serializer is designed using a differential logic family, power consumption is still high. Hence, a hybrid combination of full-swing logic (at low frequency) and differential logic (at high frequency) is preferred. The usage of two entirely different logic families, however, poses a significant signal reliability problem at the interface between the two logic families. To alleviate this problem, careful designing is required, which requires more design resources and time. Also, differential circuits have additional overhead of current-source reference circuits to provide reference for the tail current in the differential logic.

FIG. 1 shows an exemplary serializer, which recieves input signals 120, 122, 124, and 126. Each input bit exhibits either a high or low voltage indicative of either a high or low bit value. The input data is received in parallel at a frequency of 625 MHz. The serializer of FIG. 1 includes three instances of circuit blocks 130 (shown as 130A, 130B, and 130C), each having two flip-flops 132 and a multiplexer 134 to generate a single output signal containing data of both input signals at twice the input frequency. In a first frequency domain of f/4, e.g., 625 MHz, input signals 120 and 122 are multiplexed to output signal 140 by circuit block 130A, and input signals 124 and 126 are multiplexed to output signal 144 by circuit block 130B. Output signals 140, 144 are taken as input signals to circuit block 130C in the f/2 domain having a frequency of f/2, e.g., 1.25 GHz. Output signal 150 of circuit block 130C is passed through a flip-flop 152, which is in the frequency domain of f, e.g., 2.5 GHz and provides an output signal 154 of serialized data having a frequency 4 times that of input signals 120, 122, 124, 126.

This approach to serializing data has significant disadvantages. First, this design contains three levels of flip-flop logic, which operate at frequencies of f/4, f/2, and f as described above. Four operate at f/4 frequency, two operate at f/2 frequency, and one flip-flop operates at f frequency. The total switching power due to clocks is given by:

$$\text{Total Clock Switching Power} = 4 \cdot (CV^2 f/4) + 2 \cdot (CV^2 f/2) + 1 \cdot (CV^2 f)$$
$$= 3CV^2 f,$$

where C is the input capacitance of the clock line of a flip-flop, f is the frequency of the clock on the output flip-flop 152, and V is power supply voltage. Note that this equation is an approximate equation since the power consumed by the multiplexer is not incorporated. In general for a $2^N$:1 serializer, total clock switching power=$(N+1)CV^2 f$.

The primary concern in using a full-swing serializer for high-speed applications is power. Any improvement in the serializing technique that addresses power would greatly improve the design cycle time and total system power.

SUMMARY OF THE INVENTION

Broadly speaking, the present invention fills this need by providing a digital circuit for multiplexing multiple data streams. An exemplary circuit performs multiplexing at high speeds with very low power drawn. It should be appreciated that the present invention can be implemented in numerous ways, including as a process, an apparatus, a system, a device, or a method.

In one embodiment, a serializer circuit multiplexes 2N parallel data streams, each data stream having a frequency of $f/(2^N)$, N being a positive integer. The serializer comprises $2^N-1$ instances of a dual edge multiplexing flip-flop circuit, each of which functions in one of N frequency domains including a first frequency domain having a frequency $f/2^N$ and a last frequency domain having a frequency f/2; and an output providing serialized data at frequency f. The highest clock signal frequency input into the serializer has a frequency f/2. Each dual edge multiplexing flip-flop circuit captures data on both edges of the clock signal; hence, the output data rate is twice that of the input data rate but clocked at half of the frequency.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

The term, "serializer" is intended to mean a device that receives parallel data from separate data streams and combines them together into a single serial data signal without any data loss. A "serializer" performs this function by converting incoming parallel bits of data into a single data stream with the bits in series.

Figure 2:
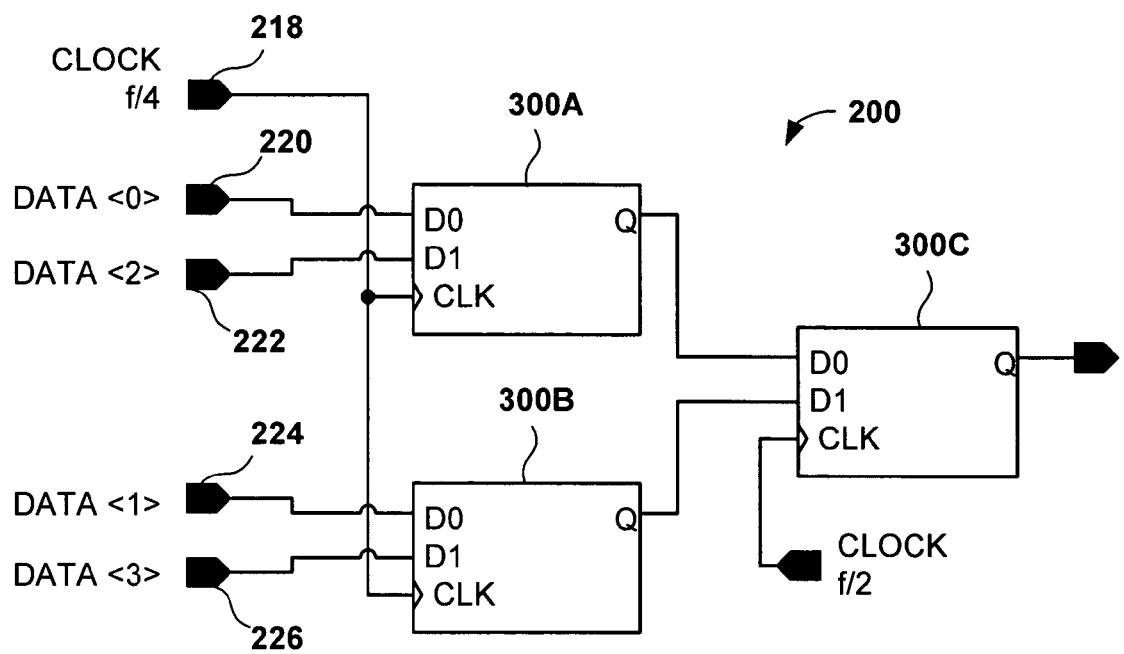
FIG. 2 shows an exemplary 4-to-1 serializer utilizing three dual-edge triggered multiplexer flip-flops, in accordance with embodiments of the invention.

FIG. 2 shows an exemplary 4-to-1 serializer 200, according to embodiments of the invention, that generates an output signal Q containing data from input signals 220, 222, 224, and 226 at a frequency f. Serializer 200 is an exemplary circuit having two frequency domains f/4 and f/2, providing an output data signal at frequency of f. A circuit 300 is instantiated three times in the 4-to-1 serializer 200 at 300A, 300B, and 300C. Circuits 300A and 300B function in a frequency domain of f/4 and accept data from input signals 220, 222, 224, and 226, and a clock signal 218 coupled to these inputs having a frequency of f/4. Circuit 300C functions in the f/2 domain and accepts data signals and a clock signal at a frequency of f/2, providing an output serialized data signal having a frequency of f.

Each circuit 300 is a dual-edge multiplexer flip-flop. Input signals 220, 222 are input into circuit 300A at a frequency f/4, which provides an output signal at frequency f/2. Likewise, input signals 224, 226 are input into circuit 300B. Output signals of circuits 300A, 300B are input into circuit 300C at a frequency f/2, providing output signal Q at a frequency of f, with data output at both the rising and falling edge of the clock signal, which is input into circuit 300C at a frequency of f/2. No additional flip-flop at frequency f at the output is necessary as was the case with the conventional circuit shown in FIG. 1. As would occur to a person having ordinary skill in the art, dual-edge multiplexer flip-flops of the type shown in FIG. 2 could be combined to form a serializer having any of $2^N$ inputs.

Figure 1:
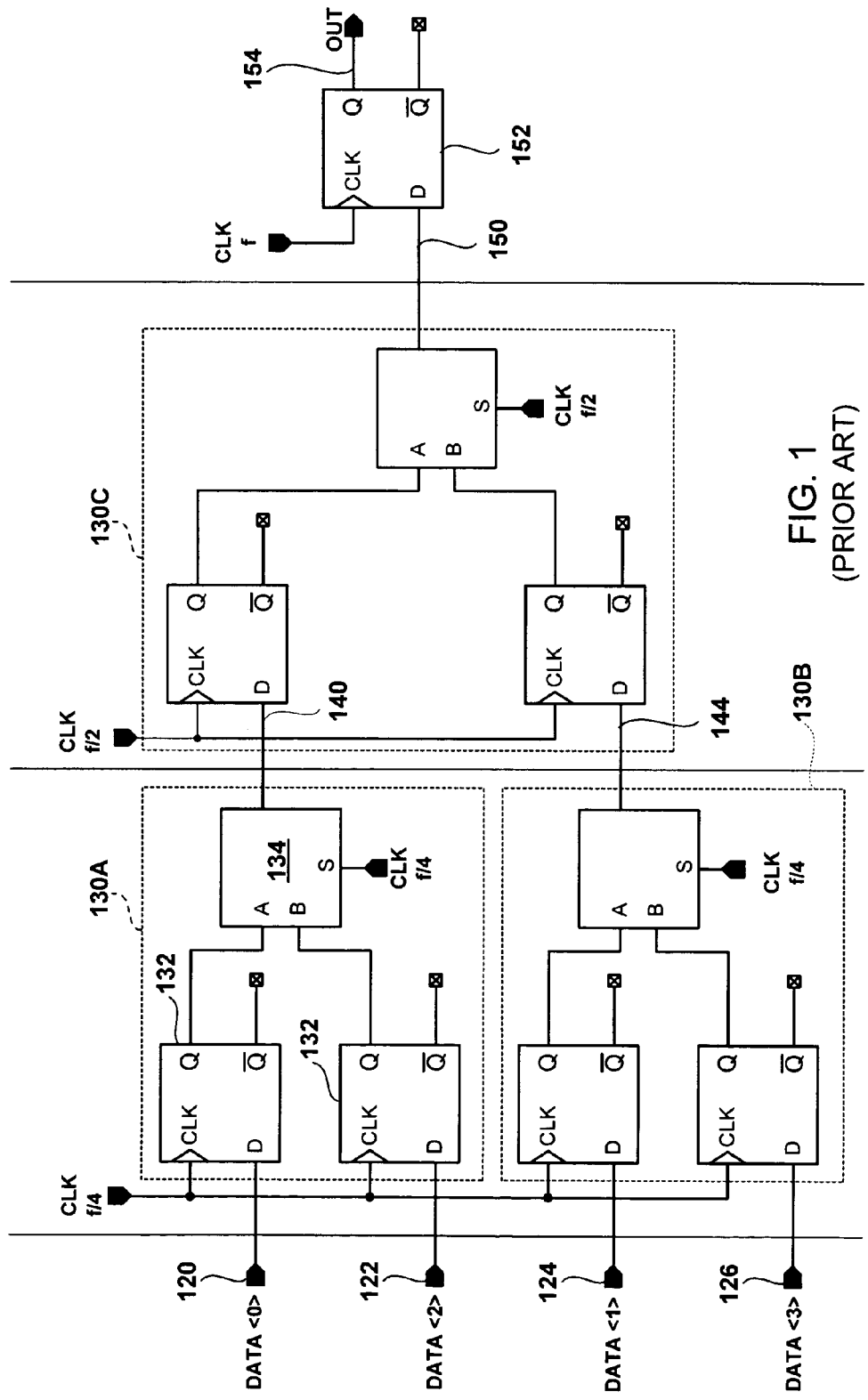
FIG. 1 shows a conventional 4-to-1 serializer.

Advantageously, the power requirement for serializer 200 is much less than that for the prior art circuit shown in FIG. 1. Since serializer 200 uses only two clock domains (f/2 and f/4) to provide the same throughput as the serializer shown in FIG. 1, the total switching power is:

$$\text{Total clock switching power} = 2 \cdot (C_1 V^2 f / 4) + 1 \cdot (C_1 V^2 f / 2)$$
$$= 2 \cdot (C_1 V^2 f / 2)$$

where $C_1$ is capacitance on the clock line of the dual-edge triggered flip-flop. Remembering that C is the capacitance on the clock line for the prior art circuit, it should be noted that $C_1 << 2*C$. $C_1$ is not equal 2*C since the new design is compact and the clock lines are shorter. In general, for a $2^N:1$ serializer using circuits 300, total clock switching power is $N*(C_1 V^2 f/2)$. Compared to a conventional serializer, the serializer of this invention consumes very low power especially for larger numbers of inputs N.

Figure 3:
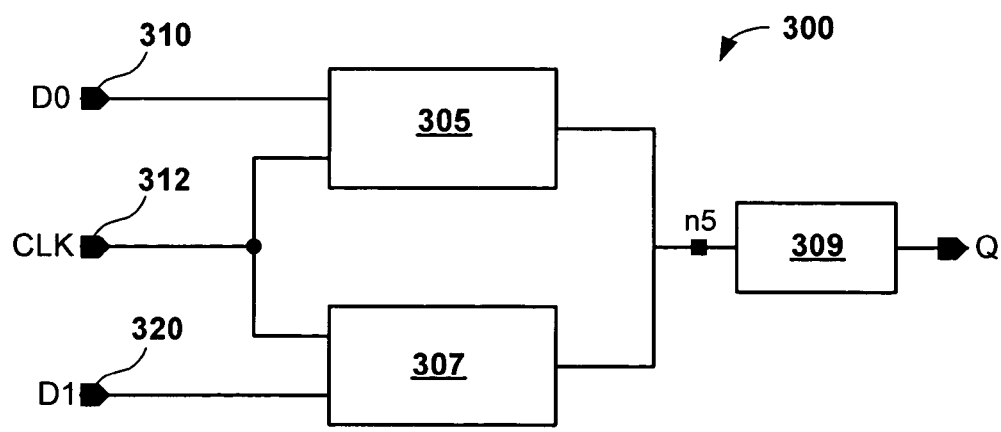
FIG. 3 shows one dual-edge triggered multiplexer flip-flop of FIG. 2 in simplified form having three component circuit blocks.

FIG. 3 shows circuit 300 in simplified form having three main circuit blocks. Circuit block 305 receives a first data signal (D0) 310 and a clock signal 312. When the clock signal goes from low to high, a latched input value is passed, inverted, to output node n5. When the clock is low, the output signal of circuit block 305 floats, and circuit block 309 takes the output signal of circuit block 307. Circuit block 307 receives a second data signal (D1) 320 and the clock signal 312. When the clock signal goes from high to low, a latched input value is passed, inverted, to output node n5. When the clock is high, the output signal of circuit block 307 floats, and circuit block 309 takes the output signal of circuit block 305. By "float" it is meant that there is no path through the circuit block to either ground or supply voltage Vdd. By "inverted" it is meant that the voltage is converted from high to low or from low to high. Although the signal at n5 is inverted from the corresponding data input signal, it is still indicative of input signal and need only be inverted again to properly follow the input data. In one embodiment, circuit block 309 is a simple inverter, and will therefore invert the signal at n5 to generate Q.

By capturing data on both edges of the clock signal, exemplary circuit 300 provides a dual-edge triggered integrated multiplexer flip-flop that generates serialized data flow at twice the clock frequency applied to the output stage. That is, the output data rate is twice that of the input data rate but clocked with half the frequency that is required in a single-edge triggered flip-flop. This reduction in frequency reduces power in comparison with a standard single-edge triggered flip-flop for an identical throughput.

Figure 4:
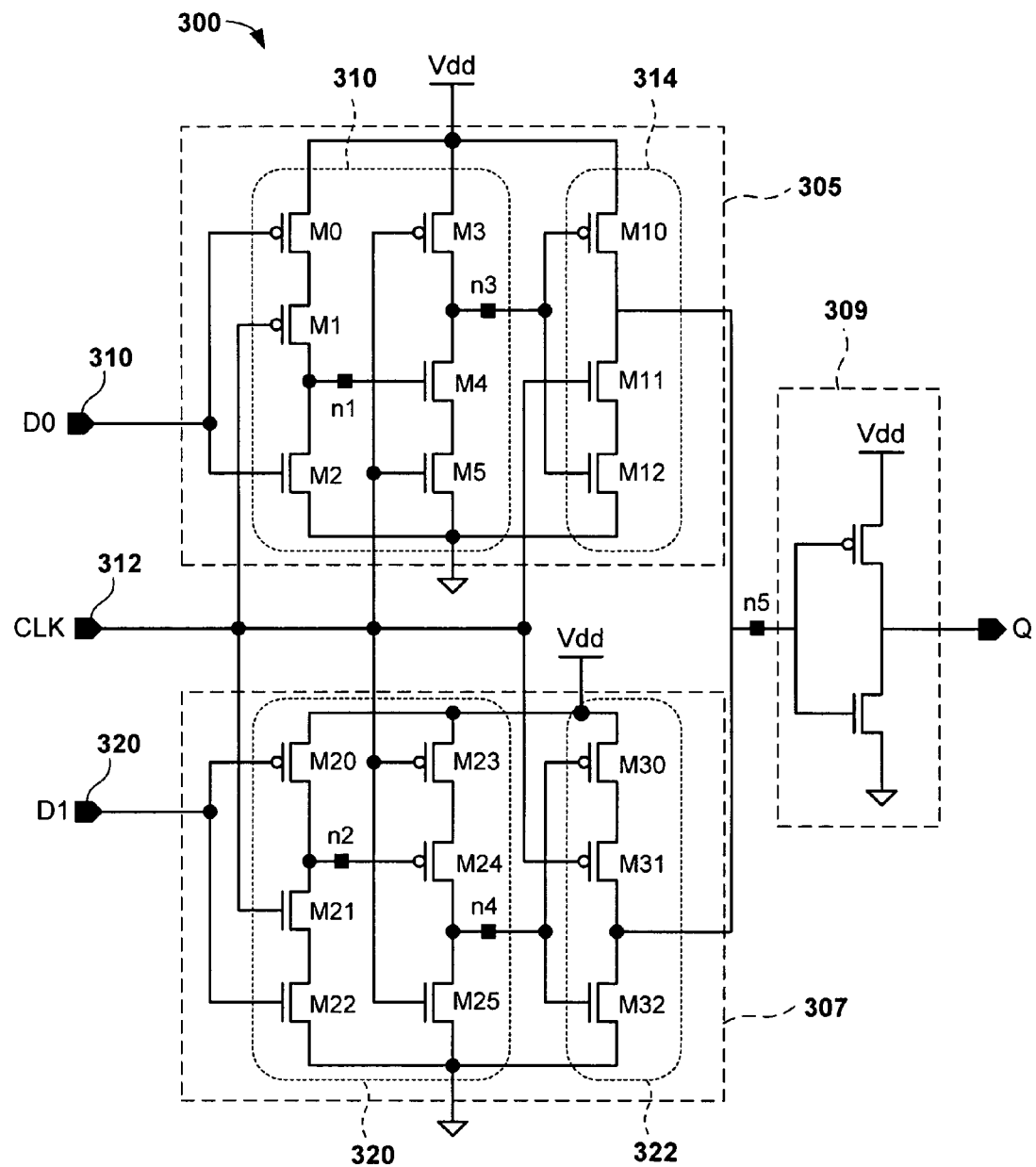
FIG. 4 shows one dual edge triggered multiplexer flip-flop of FIG. 2 in detail.

FIG. 4 is a circuit diagram of the exemplary serializing circuit 300. Again, this is a circuit that receives two data input signals D0, D1 and a clock signal CLK at frequency f/2 and outputs data at frequency f. Upper circuit block 305 operates on D0 and lower circuit block 307 operates on D1. D0 is output when CLK is high, and D1 is output when CLK is low.

Upper circuit block 305 and lower circuit block 307 each have a master latch 310, 320, and a slave latch 314, 322, respectively. The master latches are separate, and they hold respective data bits stable when the slave latches samples the data. The two slave latches 314, 322 act in a complementary fashion enabling them to be tied together to form a multiplexer. The circuits of blocks 305 and 307, as well as that of inverter block 309 are preferably CMOS type logic circuits.

Master latch 310 is formed from transistors M0–M5. When CLK is low, M1 is on. When M1 is on, M0 and M2 invert D0 such that the signal at n1 is high when D0 is low and low when D0 is high. Continuing with CLK being low, M3 is on and M5 is off. Therefore the signal at n3 is pinned to high. With the n3 signal being high, M10 is off. M11 is also off because CLK is still low. This isolates n5 from D0, Vdd and ground, allowing the n5 signal to float when CLK is low.

When CLK is high, M1 and M3 are off and M5 is on. When the n1 signal is low, M4 is off and the n3 signal does not discharge. When the n1 signal is high, M4 is on. With CLK and the n1 signal being high, the n3 signal is allowed to discharge through M4 and M5. Thus, at the instant of CLK going from low to high, M10 either turns on or remains off (based on whether the signal at n3 discharges or not) and M11 turns on thereby connecting n5 to either supply voltage Vdd via M10 or ground via M11 and M12, depending on the n3 signal.

Note that master latch 310 drives slave latch 314, and that circuit block 305 outputs the inverse of D0 at n5 when CLK is high, and causes the signal at n5 to float when CLK is low.

Referring now to circuit block 307, when CLK is high, M21 is on and therefore the inverse of D1 appears on n2, M20, M22 acting as an inverter. When the n2 signal is high, M24 is off and when the n2 signal is low M24 is on. When CLK is high, M25 is on, thereby pinning n4 to ground. The n4 signal controls transistors M30 and M32 such that, when n4 is grounded, M30 is on and M32 is off. While CLK is high, M31 is off. Since both M31 and M32 are off and n5 is connected between these two transistors, the signal at n5 is allowed to float while CLK is high.

When CLK is low, M21 and M25 are off. Thus, when the n2 signal is high, M24 is off; therefore n4 cannot be charged to Vdd since current cannot flow from Vdd though M24 to n2. When the signal at n2 is low, M24 is on and n4 communicates with Vdd via M23 and M24 thereby charging n4 to Vdd. Thus, at the instant of CLK going from high to low, if the n2 signal is low, n4 is allowed to charge thereby turning M32 on and connecting n5 to ground. If, at the instant CLK goes from high to low, the signal at n2 is high, n4 is not permitted to charge, M31 turns on, and n5 is connected to Vdd.

Note that master latch 320 latches D1 and provides a stable input to the slave latch 322 when CLK is low.

Thus, n5 is connected to either Vdd or ground via circuit block 305 when CLK is high and either Vdd or ground via circuit block 307 when CLK is low. The signal at n5 is inverted D0 when CLK is high and inverted D1 when CLK is low. Note also that the n5 signal propagates through inverter circuit block 309 so that output Q follows inputs D0 and D1 but at twice the frequency.

The circuitry of FIGS. 2–4 can be implemented in any number electronic devices, and can be embodied in a number of forms. For instance, the circuitry can be fabricated onto a single chip and then interfaced with other chips, components or systems. In another implementation, the circuitry can be integrated into a custom chip that has one or more other functions or cores. Once the circuit is integrated into a target application, the circuit is packaged to complete the integration. The packaged circuit can then be interfaced with other components. Still further, one embodiment may include having the chip integrated on a silicon chip having multiple fabricated levels, or alternatively formed (partially or wholly) on a printed circuit board using discrete and non-discrete devices and metal traces. Accordingly, it should be understood that the circuitry of FIGS. 2–4 can take on any number of physical forms and can be integrated individually or as part of a system.

Figure 5:
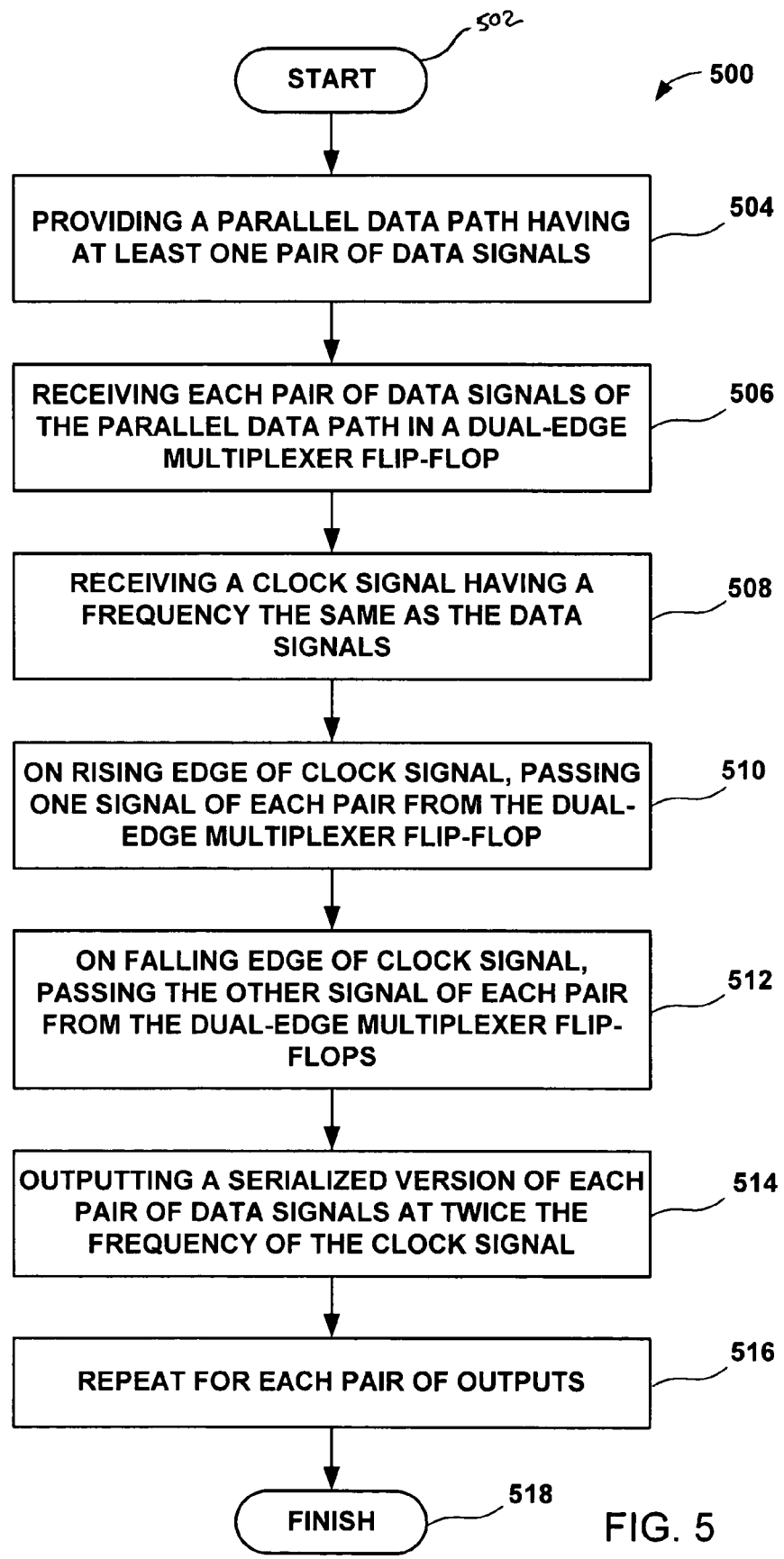
FIG. 5 shows a flowchart depicting an exemplary procedure performed by the serializer of FIG. 2.

FIG. 5 shows a flowchart 500 depicting an exemplary procedure performed by the exemplary serializer circuit of FIG. 2. The procedure starts as indicated by starting block 502 and flows to operation 504 wherein a parallel data path having at least one pair of data signals is provided. Referring to FIG. 2, a parallel data path including data<0>, data<1>, data<2>, and data<3> is provided as input signals 220, 224, 222, and 226, respectively. Operation 506 next calls for each pair of data signals to be received in a dual-edge multiplexer flip-flop.

This is represented in FIG. 2, for example, by data<0> and data<2> being received into circuit 300A and data<1> and data<3> being received into circuit 300B. As mentioned previously, circuits 300A and 300B are each an instance of a dual-edge multiplexer flip-flop circuit. From operation 506, the procedure flows to operation 508 wherein a clock signal having the same frequency as that of the data signals is received. FIG. 2 shows a clock signal 218 having a frequency f/4, which is the same frequency as the data input signals mentioned previously.

Referring back to FIG. 5, the procedure next flows to operation 510 wherein on one edge, e.g., a rising edge, of the clock signal, each dual-edge multiplexer flip-flop passes one signal of the pair received in operation 506. Next, in operation 512, the other signal from each pair is passed from each dual-edge multiplexer flip-flop on the other edge, e.g., a falling edge, of the clock signal.

Referring to FIG. 2, circuit 300A passes data<0> at the rising edge of clock signal 218 and data<2> at the falling edge. Likewise, circuit 300B passes data<1> at the rising edge and data<3> at the falling edge. This results in two serialized output signals Q, one containing data<0,2> and the other data<1,3> wherein data<0> and data<1> are passed on the rising edge of clock signal 218 and data<2> and data<3> are passed on the falling edge.

Referring back to FIG. 5, the procedure flows from operation 512 to operation 514 wherein a serialized version of each pair of data signals is output at twice the clock frequency at that stage. These signals, as mentioned above, are represented by the outputs Q of circuits 300A and 300B in the exemplary circuit shown in FIG. 2.

Next, the procedure flows to operation 516 wherein the previous steps are repeated for each pair of output signals. In the example shown in FIG. 2, there are two output signals Q, one each from circuits 300A and 300B. This comprises a parallel data path, and this final pair of data signals is received into a dual edge multiplexer circuit 300C. A clock signal having frequency now of f/2 is received in circuit 300C. The input signals are then serialized as described previously with respect to operations 510, 512, and 514 with output Q from circuit 300C being data<0,1,2,3> over the course of two clock cycles.

After no more pairs of signals are present, the procedure ends as indicated by finish block 518.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A serializer for multiplexing $2^N$ data streams, each data stream having a frequency of $f/(2^N)$, N being a positive integer, the serializer comprising:

one less than $2^N$ instances of a dual edge multiplexer flip-flop circuit, each dual-edge multiplexer flip-flop circuit functioning in one of N frequency domains including a first frequency domain having a frequency $f/2^N$ and a last frequency domain having a frequency $f/2$, wherein each dual-edge multiplexer flip-flop circuit is configured to receive a clock signal and two input data signals each having a frequency of the frequency domain in which that dual-edge multiplexer flip-flop circuit functions and is configured to generate an output data signal having a frequency approximately twice the frequency of the input data signals and the clock signal, wherein the highest clock signal frequency input into the serializer is f/2, the serializer being configured to generate an output signal representing a serialized data stream at frequency f;

wherein each dual-edge multiplexer flip-flop circuit comprises a plurality of transistors propagating a first data signal of the two input data signals and a second data signal of the two input data signals to a common output node, wherein each of the first and second data signals is applied to a respective master latch, each of which has a respective node that is in communication with a respective slave latch, the slave latches cooperating as a multiplexer to pass the first data signal from one of the two master latch nodes when the clock signal is in a first state and to pass the second data signal from the other of the two master latch nodes when the clock signal is in a second state, thereby generating an output data stream having a frequency that is approximately twice the frequency of the input data signals.

2. The serializer of claim 1, wherein the first state of the clock signal is high and the second state of the clock signal is low.

3. The serializer of claim 1, wherein a first group of the plurality of transistors are embodied in a first circuit block and a second group of the plurality of transistors are embodied in a second circuit block, each circuit block including one of the master latches and one of the slave latches, each circuit block having no more than 9 transistors.

4. The serializer of claim 3, wherein each of the first and second circuit blocks is in communication with the common output node, the first circuit block providing a floating signal value at the common output node during one half of the clock signal cycle and the second circuit block providing a floating signal value at the common output node during the other half of the clock signal cycle.

5. The serializer of claim 1, wherein the plurality of transistors are formed on an integrated circuit chip.

6. The serializer of claim 1, wherein each dual-edge multiplexer flip-flop comprises:
a first circuit block having a first data input for receiving the first data signal and a clock signal input for receiving the clock signal; and
a second circuit block having a second data input for receiving the second data signal and a clock signal input for receiving the clock signal;
the first and second circuit blocks having the common output node, wherein the first circuit block provides a floating signal at the common output node during one half of each cycle of the clock signal and a signal indicative of the first data signal at the common output node during the other half of each clock signal cycle, and wherein the second circuit block provides a floating signal at the common output node during the other half of each clock cycle and a signal indicative of the second data signal at the common output node during the one half of each clock signal cycle.

7. The serializer of claim 6, wherein the first circuit block isolates the common output node from a supply voltage and a ground when the clock signal is low and outputs a signal indicative of the first data signal when the clock signal is high, and the second circuit block isolates the common output node from the supply voltage and the ground when the clock signal is high and outputs a signal indicative of the second data signal when the clock signal is low.

8. The serializer of claim 7, wherein the signal indicative of the first data signal is an inverted version thereof and the signal indicative of the second data signal is an inverted version thereof, the dual-edge multiplexer flip-flop further comprising an inverter having an input coupled to the common output node, the inverter outputting a non-inverted signal indicative of the first data signal or the second data signal, depending upon a state of the clock signal.

9. The serializer of claim 6, wherein each of the first circuit and second circuit blocks comprise a master latch, a slave latch, and a connection node, wherein the master latches hold respective connection node signals stable while the slave latches sample the respective connection node signals.

10. The serializer of claim 9, wherein the slave latch of the first circuit block and the slave latch of the second circuit block cooperate to function as a multiplexer.

11. An integrated circuit formed on a chip, the integrated circuit comprising a serializer for multiplexing $2^N$ data streams, each data stream having a frequency of $f/(2^N)$, N being a positive integer, the serializer comprising one less than $2^N$ instances of a dual edge multiplexer flip-flop circuit, each dual-edge multiplexer flip-flop circuit functioning in one of N frequency domains including a first frequency domain having a frequency $f/2^N$ and a last frequency domain having a frequency $f/2$, wherein each dual-edge multiplexer flip-flop circuit is configured to receive a clock signal and two input data signals each having a frequency of the frequency domain in which that dual-edge multiplexer flip-flop circuit functions and is configured to generate an output data signal having a frequency approximately twice the frequency of the input data signals and the clock signal, wherein the highest clock signal frequency input into the serializer is $f/2$, the serializer being configured to generate an output signal representing a serialized data stream at frequency f;

wherein each dual-edged multiplexer flip-flop circuit comprises:
means for receiving a first data signal of the two data signals at the frequency of the frequency domain in which the dual-edge multiplexer flip-flop circuit functions;
means for receiving a second data signal of the two data signals at the frequency of the frequency domain in which the dual-edge multiplexer flip-flop circuit functions;
means for receiving the clock signal having the frequency of the frequency domain in which the dual-edge multiplexer flip-flop circuit functions; and
a plurality of transistors propagating the first data signal and the second data signal to a common output node, wherein each of the first and second data signals is applied to a respective master latch, each of which has a respective node that is in communication with a respective slave latch, the slave latches cooperating as a multiplexer to pass the first data signal from one of the two master latch nodes when the clock signal is in a first state and to pass the second data signal from the other of the two master latch nodes when the clock signal is in a second state, thereby generating an output data stream having a frequency that is approximately twice the frequency of the input data signals.

12. The integrated circuit of claim 11, wherein the first state of the clock signal is high and the second state of the clock signal is low.

13. A method for serializing data, comprising:
receiving $2^N$ input data signals of a parallel data path, each input data signal having a frequency of $f/(2^N)$;
receiving a plurality of clock signals, each at a specified frequency, the highest being frequency $f/2$;
processing the $2^N$ input data signals using $2^N-1$ dual edge multiplexer flip-flop circuits; and
outputting an output signal representing a serialized version of the 2N input data signals, the output signal having a frequency f;
wherein each dual-edge multiplexer flip-flop circuit comprises a plurality of transistors propagating a first data signal of the two input data signals and a second data signal of the two input data signals to a common output node, wherein each of the first and second data signals is applied to a respective master latch, each of which has a respective node that is in communication with a respective slave latch, the slave latches cooperating as a multiplexer to pass the first data signal from one of the two master latch nodes when the clock signal is in a first state and to pass the second data signal from the other of the two master latch nodes when the clock signal is in a second state, thereby generating an output data stream having a frequency that is approximately twice the frequency of the input data signals.

* * * * *